United States Patent [19]

Messer

[11] Patent Number: 4,698,286

[45] Date of Patent: Oct. 6, 1987

[54] PLASMA DEVELOPABLE PHOTORESIST COMPOSITIONS CONTAINING PERYLENE COUMARIN PHOTOSENSITIZER

[75] Inventor: Wayne R. Messer, Landenberg, Pa.

[73] Assignee: Hercules Incorporated, Wilmington, Del.

[21] Appl. No.: 740,655

[22] Filed: Jun. 3, 1985

[51] Int. Cl.$^4$ .................................................. G03C 1/70
[52] U.S. Cl. ..................................... 430/17; 430/271; 430/272; 430/275; 430/281; 430/325; 430/919; 430/924; 430/925; 430/926; 430/920; 522/26; 522/30; 522/63
[58] Field of Search ............... 430/281, 920, 924, 925, 430/926, 344, 17, 325, 919, 271, 272, 275; 204/159.22; 522/26, 30, 63

[56] References Cited

U.S. PATENT DOCUMENTS

| | | | |
|---|---|---|---|
| 3,533,797 | 10/1970 | James et al. | 96/90 |
| 3,640,718 | 2/1972 | Smith | 430/925 |
| 3,899,338 | 8/1975 | Lewis | 430/925 |
| 3,925,077 | 12/1975 | Lewis et al. | 96/115 P |
| 4,147,552 | 4/1979 | Specht et al. | 96/115 |
| 4,278,753 | 7/1981 | Lewis et al. | 430/283 |
| 4,289,844 | 9/1981 | Specht et al. | 430/281 |

FOREIGN PATENT DOCUMENTS 88-607   9/1983   European Pat. Off. .

*Primary Examiner*—Richard L. Schilling
*Attorney, Agent, or Firm*—Joanne W. Patterson

[57] ABSTRACT

Disclosed are plasma developable photoresist compositions that possess photosensitivity to 436 n.m. light and maintain this photosensitivity for suitable periods of time after coating are obtainable. These compositions comprise perylene, certain perylene derivatives, or certain coumarin derivatives as photosensitizers in combination with N-vinyl monomers, haloalkene photoinitiators, and suitable polymeric binders in a suitable solvent.

11 Claims, No Drawings

PLASMA DEVELOPABLE PHOTORESIST COMPOSITIONS CONTAINING PERYLENE COUMARIN PHOTOSENSITIZER

The present invention relates to an improvement in photoresists useful in the production of precision microelectronic devices developable by totally dry techniques such as, for example, disclosed in U.S. Pat. No. 4,278,753 issued to Lewis, et al, the disclosure of which is incorporated herein by reference. More particularly, it relates to the use of perylene, certain perylene derivatives, and certain coumarin derivatives as photosensitizers in the photoresists.

It is an object of this invention to produce photoresists that are photosensitive to visible light and, at the same time, retain the advantageous properties, e.g., long coated part life and good photospeed, which the photoresists disclosed in the Lewis patent possess.

BACKGROUND OF THE INVENTION

It is known that microelectronic photoresists are coated onto substrates such as silicon and copper to make compositions, which, when exposed to light and developed, are useful as, for example, in the manufacture of integrated circuits.

To further increase the resolution capabilities of photoresists, dry plasma development processes were created to avoid the unpredictable image swelling which resulted from solvent developing techniques. Plasma developable photoresists are disclosed in said U.S. Pat. No. 4,278,753.

Stepper cameras have been increasingly used as light sources in photoresist production to provide better resolution, alignment, and fewer defects in the plasma developed image.

The photoresists disclosed in the said U.S. Pat. No. 4,278,753 patent are highly sensitive to a light wavelength of about 366 n.m., i.e., ultraviolet light. However, the stepper cameras operate preferably at about 436 n.m., i.e., visible light, because of the high costs involved in equipping the cameras with the quartz lenses necessary to focus 366 n.m. light. Although the Lewis patent does disclose the use of sensitizers to extend the spectral response of the photoresist compositions therein, the thus sensitized compositions have a short coated part life, i.e., after coating the composition onto the desired substrate, it begins to lose its sensitivity after a very short time, requiring exposure immediately after coating. Therefore, the need exists for a photoresist that is sensitive to visible light while maintaining an acceptable coated part life.

SUMMARY OF THE INVENTION

It has now been discovered that plasma developable photoresist compositions that possess photosensitivity to 436 n.m. light and maintain this photosensitivity for suitable periods of time after coating are obtainable. These compositions comprise perylene, certain perylene derivatives, or certain coumarin derivatives as photosensitizers in combination with N-vinyl monomers, haloalkene photoinitiators, and suitable polymeric binders in a suitable solvent.

DESCRIPTION OF THE PREFERRED EMBODIMENTS

This invention concerns a photoresist composition comprising at least one N-vinyl monomer, a haloalkene photoinitiator, a solvent and a photosensitizer selected from the group consisting of perylene, lower alkyl derivatives of perylene, substituted lower alkyl derivatives of perylene, and coumarin compounds of the general formula

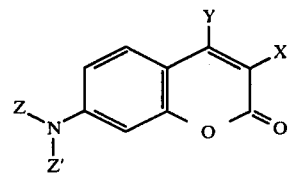

wherein: X is H, CN, COR, or $CO_2R'$ wherein $R'$ is hydrogen or lower alkyl, and R is lower alkyl, phenyl, or lower alkyl substituted phenyl; Y is H or $CF_3$; Z and $Z'$ are independently lower alkyl or collectively members of a structure having the configuration

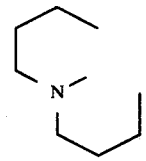

either X or Y must be H; and both X and Y cannot be H.

Typical examples of perylene and coumarin compounds usable in accordance with this invention are found in the Examples section herein.

Typical binders usable in accordance with this invention are, for example, polyvinylbutyral, polyvinylalcohol-vinylacetate, polyvinyl acetate, vinyl acetate-vinylchloride copolymer, polyvinyl propionate, polyvinyl butyrate, copolymer of polystyrene and polysulfone, polyvinyl ketone, copolymer of polyvinylbutyral-polyvinylalcohol-polyvinyl-acetate, hydroxyproPyl cellulose, ethyl cellulose, and cellulose acetate butyrate. Preferred binders are polyvinylbutyral and polyvinylformal.

The monomers disclosed in Table I of U.S. Pat. No. 3,899,338, incorporated by reference herein, typify monomers to be utilized in the present invention. The N-vinyl monomers of Section A of said Table I are also usable in combination with any of the other vinyl monomers listed in the Table.

The photoinitiators usable in accordance with this invention are haloalkene photoinitiators such as tetraiodoethylene, alpha, beta, beta-triiodostyrene, tetrabromoethylene, alpha, beta, beta-triodo-para-bromostyrene, alpha, beta, beta-triodo-para-nitrostyrene, and alpha, beta, beta-triodo-para-methoxy-styrene. The photosensitizers described in the U.S. Pat. No. 4,278,753 patent as discussed hereinabove, cannot be used with these photoinitiators.

The solvent varies with the binder. Solvents which are usable in accordance with this invention include, by way of example, chlorobenzene, n-butanol, chloroform, cyclohexanone, toluene +ethanol (3:2), benzene +methanol (1:1), chlorobenzene +n-butanol (4:1), butyl acetate, acetonitrile, aliphatic alcohols, methylene chloride, cyclohexanol, alcohol-water azeotropes, methyl ethyl ketone, methyl butyl ketone, methyl cellosolve, n-methyl pyrrolidone, dimethylformamide and cyclic ethers. Other usable solvents will be apparent to those skilled in the art, as well as which solvents are suitable for use with which binders.

Optionally, stabilizers can be included in the photoresist compositions. These stabilizers include, for example, phenolic compounds such as those represented by the general formula

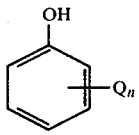

wherein Q may represent one or more hydroxyl groups, amino groups, alkyl and/or allyl groups, and n is an integer not less than 1 and not greater than 5. When n is greater than 1, all the Q's used need not be the same. Typical stabilizers are 2,6-di-t-butyl cresol, p-aminophenol, catechol, 2,4-di-t-pentylphenol, 2,5-bis(1,1-dimethylpropyl)hydroquinone, 2,6-di-t-butyl-p-phenol and 5-butyl hydroxyanisole. Other optional additives will be apparent to those skilled in the art.

Ranges for the amounts of the various components are as follows: binder—about 10% to about 90%, preferably about 30% to about 70%; monomer—about 5% to about 70%, preferably about 15% to about 60%; photoinitiator—about 1% to about 40%, preferably about 5% to about 30%; photosensitizer—about 0.01% to about 10%, preferably about 0.1% to about 5%; optional additives—about 0.1% to about 5%.

Any state of the art method for combining the components of the photoresist composition is acceptable. Typically, the components are mixed together at room temperature and then tumbled for several hours until homogenized.

In the manufacture of microelectronic devices such as, for example, printed and integrated circuits, the compositions of this invention are coated onto suitable substrates, exposed to electromagnetic radiation imagewise through a phototool (negative, mask) and developed by suitable techniques. Suitable substrates include metals such as, for example, copper or aluminum, and semiconductors such as, for example, silicon. Development of the thus exposed coated substrate involves removal of the unexposed portions of the composition from the substrate; the unpolymerized monomers are removed by heating to a temperature and for a time sufficient to remove the monomers, and the remainder of the unexposed composition is removed by suitable dry development techniques such as, for example, in an oxygen plasma as disclosed in the U.S. Pat. No. 4,278,753 patent. Other development techniques will be apparent to those skilled in the art. Before exposure, the composition is heated for a sufficient time at a temperature that will remove the solvent from the composition and provide an essentially dry coating on the substrate, without removing the polymerizable monomers therein.

The particular photosensitizers of this invention extend the electromagnetic spectrum sensitivity of the photoresist compositions in which they are included from 366 n.m. up to about 500 n.m. This permits the use of a wider variety of light sources in polymerizing the monomers of the photoresists such as, for example, stepper cameras without costly quartz lenses.

The present invention is further illustrated by the following examples, but not limited thereto. (All parts are parts by weight unless indicated otherwise.)

EXAMPLE 1

A solution of 1 part of perylene, 207.8 parts of mixed xylenes, 225.2 parts of diacetone alcohol, 0.7 parts of 2,6-di-t-butyl-4-methylphenol, 7.1 parts of tetraiodoethylene, 14 parts of N-vinylcarbazole, and 45.4 parts of binder "A", a polyvinylbutyral resin having a molecular weight of 30,000 to 34,000 (weight average) and 18–20% OH, 0–2.5% acetate, and 80% butyral functionality, is prepared by mixing, followed by tumbling overnight.

All operations are carried out under yellow light.

A clean 3" silicon wafer is coated with a few ml. of solution on a Photo-Resist Spinner, Model EC 101 from Headway Research Inc., and spun for 30 seconds at a rate of 7,000 rpm.

The coated wafer is placed on a 5.5"×8" 12 gauge aluminum tray, and the tray placed on a heat sink on the bottom of an oven at 65° C. for 5 minutes. The horizontal air-flow mechanical convection oven had an air flow at 65° C. of 16.7 ft$^3$/min.

After allowing the wafer to cool, the coating thickness is measured by making a scratch through the coating near the center of the wafer. The coating thickness measured at this scratch with a Tencor Instruments Alpha-Step Profiler with stylus radius of 12.5 microns and stylus force of 15 mg is 11,000 angstrom.

The wafer is exposed for 56 seconds to a mercury lamp through a contact mask. The light intensity at the exposure plane is adjusted to 4.5 mW/cm$^2$ as measured with a Photoresist Radiometer. A 435.8 nm three cavity visible bandpass filter with a 7.4 nm bandwidth is placed over the contact mask. This provides an intensity at 436 nm of 1.98 mW cm$^2$ when measured with a Research Radiometer.

An Opto-Line Multi-Density Resolution Target with nominal transmission values from 1% to 60% is employed as the contact mask. Each transmission area contains lines and windows from 50 microns to 1 micron.

The exposed wafer is heated in a similar manner as in the pre-exposure heating with the tray resting on a 6"×8"×¼" aluminum plate in an oven at 110° C. for 5 minutes. The air flow measured at 110° C. is 10 ft$^3$/min.

The coating thickness in unexposed areas after the hard bake as measured on the scratch with the Alpha-Step Profiler is 8,800 angstrom.

The wafer is developed in a parallel plate plasma unit in a 50/50 argon/oxygen plasma at 1 torr. An energy density of 0.2 W/cm$^2$ is employed and the plate temperature is maintained at 40°±0.1° C. After 6.5 minutes of plasma development, the coating is completely removed from the unexposed areas.

The height of the 50 micron bars in the different transmittance areas is then measured with the Alpha-Step Profiler. The bars in the 12% transmission area are 8,700 angstrom high. The 12% transmission area corresponds to a sensitivity of 13 mJ/cm$^2$.

EXAMPLE 2

A solution of 1.2 parts of perylene, 205 parts of mixed xylenes, 221 parts of diacetone alcohol, 1.1 parts of 2,6-di-t-butyl-4-methylphenol, 11.6 parts of tetraiodoethylene, 22.7 parts of N-vinylcarbazole, and 38.6 parts of binder "B", a polyvinylformal resin of 26,000 to 34,000 molecular weight (weight average) having 5.5–7.0% OH, 22–30% acetate, and 68% formal functionality, is prepared as in Example 1. Preparation and exposure of a wafer as in Example 1 using a 5,000 rpm spin speed and 9 minutes of plasma processing gives a clean wafer in which the 50 micron bars in the 40% transmission area are 8,400 angstrom high. This corresponds to an exposure sensitivity of 44 mJ/cm².

EXAMPLE 3

A solution of 10.06 parts of perylene, 3,280 parts of monochlorobenzene, 820 parts of 1-butanol, 9.18 parts of 2,6-di-t-butyl-4-methylphenol, 96.84 parts of tetraiodoethylene, 189.9 parts of N-vinylcarbazole, and 322.6 part of binder "C", a polyvinylformal resin having a molecular weight of 16,000 to 20,000 (weight average) and 5.0-6.5% OH, 9.5-13% acetate, and 82% formal functionality, is prepared as in Example 1. Preparation and exposure of a wafer as in Example 1 using a 28 second exposure and 10 minutes of plasma processing gives a clean wafer in which the 50 mu bars in the 14% transmission area are 7,200 angstrom high. This corresponds to an exposure sensitivity of 8 mJ/cm².

EXAMPLES 4-7

Solutions of 1,734 parts of monochlorobenzene, 434 parts of 1-butanol, 5 parts of 2,6-di-t-butyl-4-methylphenol, 51 parts of tetraiodoethylene, 100 parts of N-vinylcarbazole, and 171 parts of binder "C" with the amounts of perylene indicated in Table II are prepared as in Example 1. Preparation and exposure of wafers as in Example 1 using the exposure times shown and 10 minutes of plasma processing gives clean wafers with the photosensitivity shown. With the highest concentration of perylene, it is necessary to warm the solution to aid in obtaining a clear solution.

TABLE I

| Example | Photosensitizer | Exposure (sec.) | Photospeed (mJ/cm²) |
|---|---|---|---|
| 4 | Perylene- 1.3 parts | 112 | 40 |
| 5 | Perylene- 2.6 parts | 56 | 11 |
| 6 | Perylene- 5.3 parts | 28 | 8 |
| 7 | Perylene- 10.6 parts | 14 | 6 |

EXAMPLE 8

As an example of the use of prior art photosensitizers, a solution is prepared using 3.1 parts of 3-ethyl-5[3-ethyl-2(3H)-benzoxazolylidene)-ethylidene]rhodanine, 230 parts of acetonitrile, 230 parts of 1-butanol, 7.1 parts of tetraiodoethylene, 13.9 parts of N-vinylcarbazole, 45.4 parts of binder "A", and 0.7 parts of 2,6-di-t-butyl-4-methylphenol. This is processed as in Example 1 using a spin speed of 6,500 rpm and an exposure time of 224 seconds. After 6.5 minutes of plasma development, a poor image is present. The 50 micron bars in the 60% transmission area were 2,600 angstrom high indicating the coating was underexposed even though the light intensity on the coating in this area is 266 mJ/cm₂.

EXAMPLE 9

As an example showing the requirement for the organic halogen photoinitiator to be present, a solution of 5 parts of perylene, 1,060 parts of mixed xylenes, 1,140 parts of diacetone alcohol, 3 parts of 2,6-di-t-butyl-4-methylphenol, 140 parts of N-vinylcarbazole, and 227 parts of binder "A" is prepared by mixing followed by tumbling overnight. A wafer is coated with this solution and processed as in Example 1 with a 56 second exposure. No image is visible after heating at 110° C. and after plasma development for 6.5 minutes a clean wafer with no image is obtained.

EXAMPLE 10

As an example showing the lack of sensitivity at 436 nm when a photosensitizer is not present, a solution of 2,172 parts of tetraiodoethylene, 79,722 parts of mixed xylenes, 53,130 parts of n-butanol, 204 parts of 2,6-di-t-butyl-4-methylphenol, 4,272 parts of N-vinylcarbazole, and 13,908 parts of binder "A" is prepared. A wafer is coated with this solution and processed as in Example 1 with a 10 minute exposure without a negative. The coating thickness was 10,500 angstrom before heating at 110° C. and 8,000 angstrom after. This is the same drop in coating thickness observed in unexposed areas of sensitized coatings.

EXAMPLES 11-16

Solutions of 227 parts binder "A", 70 parts N-vinylcarbazole, 36 parts tetraiodoethylene, and 3 parts 2,6-di-t-butyl-4-methylphenol, and amounts of coumarin sensitizer as indicated in Table II are prepared in 1890 parts of chlorobenzene and 470 parts of n-butanol as in Example 1, using a coumarin compounds as disclosed in Table II instead of a perylene sensitizer. Preparation and exposure of a wafer as in Example 1 using a 2000-8000 rpm spin speed and 6.5 minutes plasma development time gives clean wafers with the photosensitivity shown below.

The following table summarizes the examples given:

TABLE II

| Example | Photosensitizer | | Photospeed (mJ/cm²) |
|---|---|---|---|
| 11. | Coumarin 314* | 5 parts | 33 |
| 12. | Coumarin 314* | 5 parts | 24 |
| 13. | Coumarin 153* | 12 parts | 44 |
| 14. | Coumarin 334* | 5 parts | 66 |
| 15. | Coumarin 337* | 8 parts | 66 |
| 16. | Coumarin 343* | 6 parts | 66 |

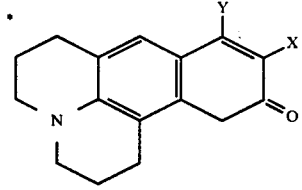

Coumarin 314: X = CO₂CH₂CH₃; Y = H
Coumarin 153: X = H; Y = CF₃
Coumarin 334: X = COCH₃; Y = H
Coumarin 337: X = CN; Y = H
Coumarin 343: X = CO₂H; Y = H

EXAMPLE 17

A solution of 7 parts of 3-acetyl-7-diethylaminocoumarin, 4260 parts of chlorobenzene, 1060 parts of n-butanol, 7 parts of 2,6-di-t-butyl-4-methylphenol, 70 parts of tetraiodoethylene, 140 parts of N-vinylcarbazole, and 454 parts of Binder A is prepared as in Example 1. A wafer coated with this solution and treated as in Example 1 has a photosensitivity of 33 mJ/cm².

EXAMPLE 18

A solution of 12 parts of 7-diethylamino-3-ethoxycarbonylcoumarin, 3280 parts of chlorobenzene, 820 parts of n-butanol, 9 parts of 2,6-di-t-butyl-4-methylphenol, 97 parts of tetraiodoethylene, 190 parts of N-vinylcarbazole, and 323 parts of Binder C is prepared and a wafer coated and treated as in Example 3. A photosensitivity of 28 mJ/cm² is obtained.

EXAMPLE 19

Example 18 is repeated substituting 11 parts of 3-benzoyl-7-diethylaminocoumarin for the coumarin in Example 18. A wafer coated and treated as in Example 18 has a photosensitivity of 55 mJ/cm².

EXAMPLE 20

Example 18 is repeated substituting 6 parts of 3-acetyl-7-diethylaminocoumarin for the coumarin in Example 18. A wafer coated and treated as in Example 18 has a photosensitivity of 55 mJ cm².

EXAMPLES 21-22

Solutions and coated wafers are prepared as in Examples 11-16 substituting amounts of perylene derivatives as indicated in Table III for the coumarins therein. Exposure and treatment of the wafer as in Example 1 gives clean wafers with the indicated photosensitivity.

TABLE III

| Example | Photosensitizer | Photospeed (mJ/cm²) |
| --- | --- | --- |
| 21 | 3-Methylperylene - 4 parts | 24 |
| 22 | 3-(Phenylmethyl)perylene - 5 parts | 33 |

A study of the Examples shows that perylene and coumarin type photosensitizers permit the production of photoresists having better photospeed than photoresists using a prior art photosensitizer as can be seen by comparing Examples 1-7 and 11-22 with Example 8.

I claim:

1. In a photoresist composition containing a polymeric binder, at least one N-vinyl monomer, a haloalkene photoinitiator, and a photosensitizer, the improvement wherein the photosensitizer comprises a coumarin compound of the general formula

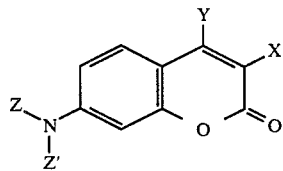

wherein: X is H, CN, COR, or CO₂R' wherein R' is hydrogen or lower alkyl, and R is lower alkyl, phenyl, or lower alkyl-substituted phenyl; Y is H or CF₃; Z and Z' are independently lower alkyl or collectively members of a structure having the configuration

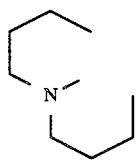

either X or Y must be H; and both X and Y cannot be H.

2. The composition of claim 1 wherein the photosensitizer is a coumarin compound wherein Z and Z' are collectively members of a structure having the configuration

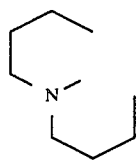

3. The composition of claim 2 wherein X is H.
4. The composition of claim 2 wherein X is CO₂H.
5. The composition of claim 2 wherein X is CO₂CH₂CH₃.
6. The composition of claim 2 wherein X is COCH₃.
7. The composition of claim 2 wherein X is CN.
8. In an element comprising a photoresist composition coated on a substrate wherein the composition contains a polymeric binder, a haloalkene photoinitiator, at least one N-vinyl monomer, and a photosensitizer, the improvement wherein the photosensitizer comprises a coumarin compound of the general formula

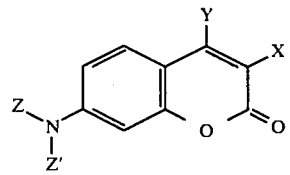

wherein: X is H, CH, COR, or CO₂R' wherein R' is hydrogen or lower alkyl, and R is lower alkyl, phenyl, or lower alkyl substituted phenyl; Y is H or CF₃; Z and Z' are independently lower alkyl or collectively members of a structure having the configuration

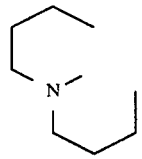

either X or Y must be H; and both X and Y cannot be H.

9. In a process comprising the steps of combining a polymeric binder, a haloalkene photoinitiator, an N-vinyl monomer, a photosensitizer and a solvent, coating the combination onto a substrate selected from the group consisting of metal, silicon, and other semiconductors, exposing the coated substrate to light of a sufficient wavelength to polymerize the monomer, and developing the light exposed, coated substrate, the improvement wherein the photosensitizer comprises a coumarin compound of the general formula

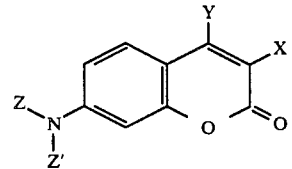

wherein: X is H, CN, COR, or CO₂R' wherein R' is hydrogen or lower alkyl, and R is lower alkyl, phenyl, or lower alkyl substituted phenyl; Y is H or CF₃; Z and Z' are independently lower alkyl or collectively members of a structure having the configuration

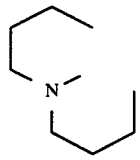

either X or Y must be H; and both X and Y cannot be H.

10. In an element comprising a substrate coated with a photoresist composition comprising at least one N-vinyl monomer, a haloalkene photoinitiator, a polymeric binder, and a photosensitizer, wherein the composition has been exposed imagewise to a sufficient amount of electromagnetic radiation to polymerize the monomers therein, the improvement wherein the photosensitizer comprises a coumarin compound of the general formula

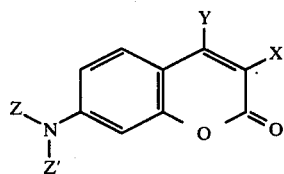

wherein: X is H, CH, COR, or CO$_2$R' wherein R' is hydrogen or lower alkyl, and R is lower alkyl, phenyl, or lower alkyl substituted phenyl; Y is H or CF$_3$; Z and Z' are independently lower alkyl or collectively members of a structure having the configuration

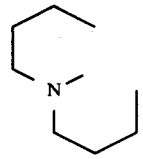

either X or Y must be H; and both X and Y cannot be H.

11. In an element comprising a substrate coated with a photoresist composition comprising at least one N-vinyl monomer, a haloalkene photoinitiator, a polymeric binder and a photosensitizer, wherein the composition has been exposed imagewise to a sufficient amount of electromagnetic radiation to polymerize the monomers therein and developed in a manner sufficient to remove the composition from the unexposed areas of the coated substrate, the improvement wherein the photosensitizer comprises a coumarin compound of the general formula

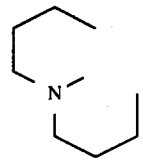

wherein: X is H, CN, COR, or CO$_2$R' wherein R' is hydrogen or lower alkyl, and R is lower alkyl, phenyl, or lower alkyl substituted phenyl; Y is H or CF$_3$; Z and Z' are independently lower alkyl or collectively members of a structure having the configuration

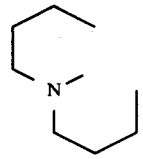

either X or Y must be H; and both X and Y cannot be H.

* * * * *